United States Patent
Economikos et al.

(10) Patent No.: US 10,522,410 B2
(45) Date of Patent: Dec. 31, 2019

(54) PERFORMING CONCURRENT DIFFUSION BREAK, GATE AND SOURCE/DRAIN CONTACT CUT ETCH PROCESSES

(71) Applicant: GLOBALFOUNDRIES Inc., Grand Cayman (KY)

(72) Inventors: Laertis Economikos, Wappingers Falls, NY (US); Hui Zang, Guilderland, NY (US); Ruilong Xie, Niskayuna, NY (US); Haiting Wang, Clifton Park, NY (US); Hong Yu, Rexford, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/958,593

(22) Filed: Apr. 20, 2018

(65) Prior Publication Data

US 2019/0326177 A1 Oct. 24, 2019

(51) Int. Cl.
*H01L 21/8234* (2006.01)
*H01L 21/762* (2006.01)
*H01L 29/66* (2006.01)
*H01L 27/088* (2006.01)

(52) U.S. Cl.
CPC ........ *H01L 21/823431* (2013.01); *H01L 21/76264* (2013.01); *H01L 29/66545* (2013.01); *H01L 27/0886* (2013.01)

(58) Field of Classification Search
CPC ............................................. H01L 21/823431
See application file for complete search history.

(56) References Cited

U.S. PATENT DOCUMENTS

| | | | |
|---|---|---|---|
| 8,846,491 B1 | 9/2014 | Pham et al. | |
| 8,916,460 B1 | 12/2014 | Kwon et al. | |
| 9,293,459 B1 * | 3/2016 | Cheng | H01L 27/0886 |
| 9,478,662 B2 * | 10/2016 | Labonte | H01L 21/76831 |
| 9,520,482 B1 * | 12/2016 | Chang | H01L 27/0924 |
| 9,911,736 B1 * | 3/2018 | Zang | H01L 27/0886 |
| 10,283,417 B1 * | 5/2019 | Huang | H01L 21/02183 |
| 2012/0211808 A1 * | 8/2012 | Wei | H01L 21/82341 257/288 |
| 2014/0117454 A1 | 5/2014 | Liu et al. | |
| 2015/0236106 A1 * | 8/2015 | Zaleski | H01L 29/41758 257/383 |
| 2015/0279936 A1 * | 10/2015 | Adam | H01L 29/66545 438/163 |

(Continued)

*Primary Examiner* — William A Harriston
(74) *Attorney, Agent, or Firm* — Amerson Law Firm, PLLC

(57) ABSTRACT

A device is formed including fins formed above a substrate, an isolation structure between the fins, a plurality of structures defining gate cavities, and a first dielectric material positioned between the structures. A patterning layer above the first dielectric material and in the gate cavities has a first opening positioned above a first gate cavity exposing a portion of the isolation structure and defining a first recess, a second opening above a second gate cavity exposing a first portion of the fins, and a third opening above a first portion of a source/drain region in the fins to expose the first dielectric material. Using the patterning layer, a second recess is formed in the substrate and a third recess is defined in the first dielectric material. A second dielectric material is formed in the recesses to define a gate cut structure, a diffusion break structure, and a contact cut structure.

20 Claims, 14 Drawing Sheets

(56) References Cited

U.S. PATENT DOCUMENTS

| | | | |
|---|---|---|---|
| 2016/0379987 A1* | 12/2016 | Liu | H01L 27/11524 257/316 |
| 2017/0005195 A1* | 1/2017 | Ching | H01L 29/7848 |
| 2017/0125543 A1* | 5/2017 | Greene | H01L 29/665 |
| 2017/0162688 A1* | 6/2017 | Wei | H01L 29/66545 |
| 2017/0345913 A1* | 11/2017 | Dai | H01L 29/66795 |

* cited by examiner

PERFORMING CONCURRENT DIFFUSION BREAK, GATE AND SOURCE/DRAIN CONTACT CUT ETCH PROCESSES

BACKGROUND OF THE INVENTION

1. Field of the Invention

The present disclosure generally relates to the fabrication of integrated circuits, and, more particularly, to various methods of performing concurrent diffusion break, gate and source/drain contact cut etch processes for FinFET semiconductor devices and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1 is a perspective view of an illustrative prior art integrated circuit product 100 that is formed above a semiconductor substrate 105. In this example, the product 100 includes five illustrative fins 110, 115, a shared gate structure 120, a sidewall spacer 125 and a gate cap 130. The product 100 implements two different FinFET transistor devices (N-type and P-type) with a shared gate structure. The gate structure 120 is typically comprised of a layer of insulating material (not separately shown), e.g., a layer of high-k insulating material or silicon dioxide, and one or more conductive material layers (e.g., metal and/or polysilicon) that serve as the gate electrode for the transistors on the product 100. The fins 110, 115 have a three-dimensional configuration. The portions of the fins 110, 115 covered by the gate structure 120 define the channel regions of the FinFET transistor devices on the product 100. An isolation structure 135 is formed between the fins 110, 115. The fins 110 are associated with a transistor device of a first type (e.g., N-type), and the fins 115 are associated with a transistor device of a complementary type (e.g., P-type). The gate structure 120 is shared by the N-type and P-type transistors, a common configuration for memory products, such as static random access memory (SRAM) cells.

Typically, fins are formed in a regular array. To define separate transistor devices, the length of the fins may be adjusted and some fins or portions of fins may be removed, such as to define diffusion breaks (DB) between gate segments. This removal process may be referred to as a diffusion break cut or "DB cut" process. Typically, an array of gate structures is formed above the remaining fin portions after the DB cut. Subsequently, a gate cut or "CT cut" process is performed to cut the gate structures in the cross direction. Source/drain (S/D) contacts (also called trench silicide (TS) contacts due to the commonly used silicide material) are typically formed after replacement gates have been formed in the remaining gate portions following the CT cut. A subsequent "TS cut" process it typically performed to segment the S/D contacts. Each of the DB, CT and TS cut processes requires a separate multilayer patterning stack and lithography process, complicating the process flow and increasing the fabrication time of the semiconductor devices.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods for performing concurrent diffusion break, gate and source/drain contact cut etch processes for FinFET semiconductor devices and the resulting devices. One illustrative method includes, among other things, forming a semiconductor device including a plurality of fins formed above a substrate, an isolation structure positioned between the plurality of fins, a plurality of sacrificial gate structures defining gate cavities, and a first dielectric material positioned between the sacrificial gate structures. A first patterning layer is formed above the first dielectric material and in the gate cavities. The patterning layer has a first opening positioned above a first gate cavity to expose a portion of the isolation structure and define a first recess, a second opening positioned above a second gate cavity to expose a first portion of the plurality of fins, and a third opening positioned above a first portion of a source/drain region defined in the plurality of fins to expose the first dielectric material. The first portion of the fins is etched through the second opening to define a second recess in the substrate. The first dielectric material is etched through the third opening to define a third recess in the first dielectric material. The third recess exposes a second portion of the plurality of fins. A second dielectric material is formed in the first recess to define a gate cut structure, in the second recess to define a diffusion break structure, and in the third recess to define a contact cut structure.

Another illustrative method includes, among other things, forming a semiconductor device including a plurality of fins formed above a substrate, an isolation structure positioned between the plurality of fins, a plurality of sacrificial gate structures defining gate cavities, a first dielectric material positioned between the sacrificial gate structures, and a gate insulation layer and a work function material layer positioned in the gate cavities and above the first dielectric material. A first patterning layer is formed above the first dielectric material and in the gate cavities. The patterning layer has a first opening positioned above a first gate cavity to expose a portion of the isolation structure and define a first recess, a second opening positioned above a second gate cavity to expose a first portion of the plurality of fins, and a third opening positioned above a first portion of a source/drain region defined in the plurality of fins to expose the first dielectric material. Portions of the gate insulation layer and the work function material layer exposed by the first and second openings and positioned in the first and second gate cavities are removed. The first portion of the fins is etched through the second opening to define a second recess in the substrate. Portions of the gate insulation layer and the work function material layer exposed by the third opening are removed. The first dielectric material is etched through the third opening to define a third recess in the first dielectric material. The third recess exposes a second portion of the plurality of fins. A second dielectric material is formed in the first recess to define a gate cut structure, in the second recess to define a diffusion break structure, and in the third recess to define a contact cut structure.

BRIEF DESCRIPTION OF THE DRAWINGS

The disclosure may be understood by reference to the following description taken in conjunction with the accompanying drawings, in which like reference numerals identify like elements, and in which.

Figure 1:
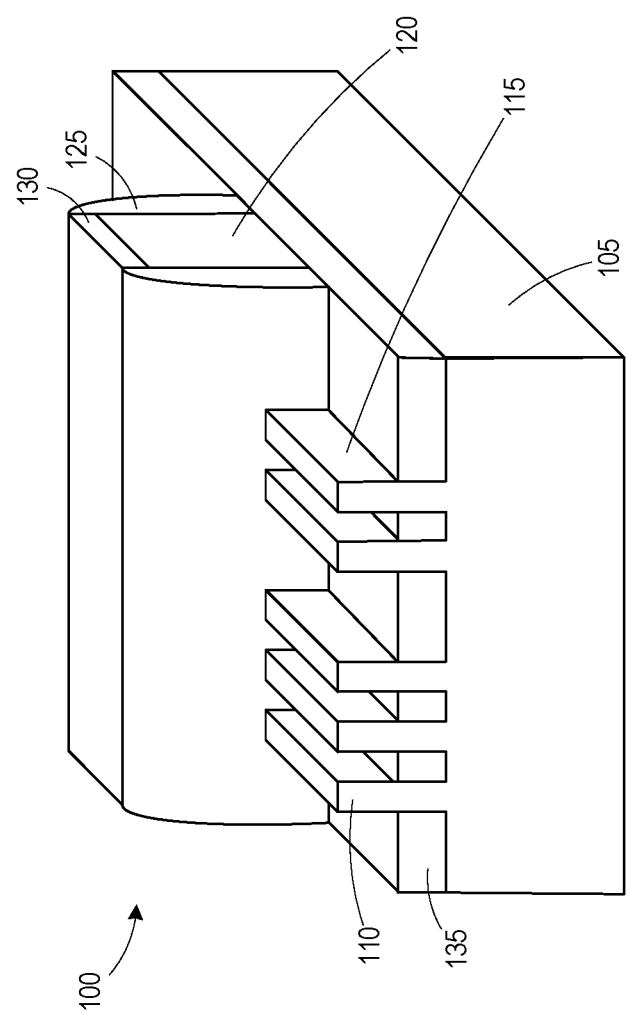
FIG. 1 is a perspective view of one illustrative embodiment of a prior art semiconductor product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of performing concurrent fin and gate cut etch processes for FinFET semiconductor devices and the resulting devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs.

The inventions disclosed herein should not be considered to be limited to the illustrative examples depicted and described herein. With reference to the attached figures, various illustrative embodiments of the methods and devices disclosed herein will now be described in more detail.

FIGS. 2A-2M depict one illustrative method disclosed for performing concurrent diffusion break, gate and source/drain contact cut etch processes for FinFET semiconductor devices and the resulting devices. The illustrative product 200 includes a plurality of fins 205 formed in a semiconductor substrate 210.

The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. The substrate 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 210 may have different layers.

Figure 2A:
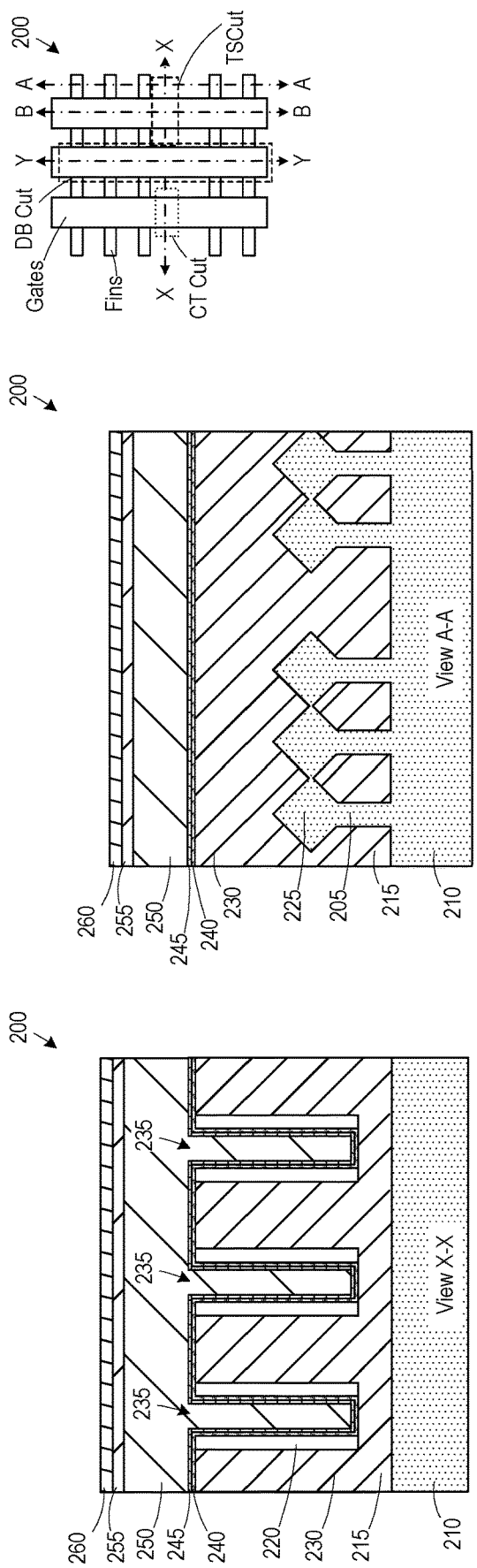
FIGS. 2A-2M depict one illustrative method disclosed for performing concurrent diffusion break, gate and source/drain contact cut etch processes for a FinFET semiconductor device and the resulting devices.
Figure 2A:
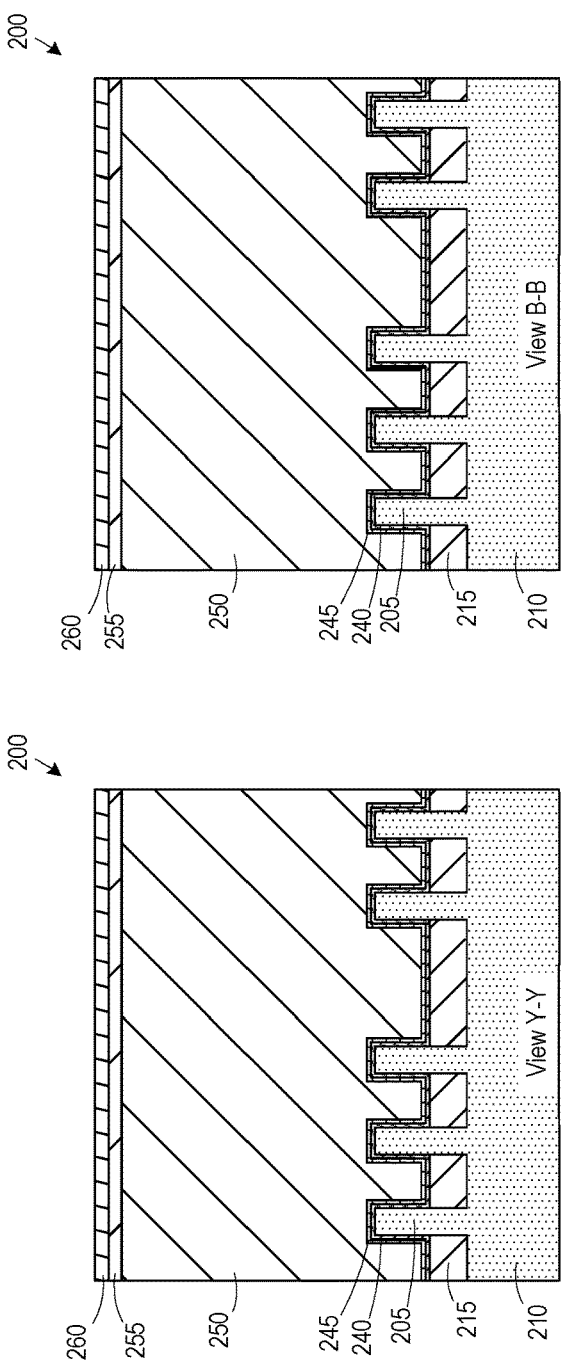

FIG. 2A depicts the product 200 at a point in fabrication wherein several process operations have been performed. First, the plurality of fins 205 were formed. In general, the fins 205 define an active region for forming devices, such as FinFET transistors. An isolation structure (e.g., STI) 215 was formed by depositing a dielectric layer (e.g., silicon dioxide) between the fins and recessing the dielectric layer. Next, sacrificial gate structures (not shown) were formed and sidewall spacers 220 were formed thereon to define placeholder gate structures. An epitaxial growth process was performed to define epitaxial material regions 225 on portions of the fins 205 not covered by the sacrificial gate structures and spacers 220. The epitaxial material regions 225 may be merged, as illustrated, or they may remain distinct. The epitaxial material regions 225 define source/drain regions of the product 200. Additional dielectric material 230 (e.g., silicon dioxide) was deposited between the fins and planarized to expose the sacrificial gate structures. An etch process was performed to remove the sacrificial gate structures to define gate cavities 235. A deposition process was performed to line the gate cavities 235 with a gate insulation layer 240 (e.g., silicon dioxide or a high-k dielectric material, such as hafnium oxide). An additional deposition process was performed to form a work function material (WFM) layer 245 (e.g., TiN). An organic patterning layer 250 (OPL) was formed above the fins 205 and in the gate cavities 235. A hard mask layer 255 (e.g., SiON) was formed above the OPL layer 250, and a bottom antireflective coating (BARC) layer 260 was formed above the hard mask layer 255.

FIGS. 2A-2M also include a simplistic plan view of the product 200 (in the upper right corner of each sheet) that depicts the location where various cross-sectional views depicted in the following drawings will be taken. More specifically, the cross-sectional view "X-X" is taken perpendicular to the long axis of the gate structures in a region where a TS cut and a CT cut are to be performed. The cross-sectional view "Y-Y" is taken along the long axis of a gate structure where a gate cut is to be performed. The cross-sectional views "A-A" and "B-B" are taken along the long axis of the gate structure through the TS cut region. Not all of the features illustrated in the views "X-X", "Y-Y", "A-A" and "B-B" are replicated in the simplistic plan view.

Figure 2B:
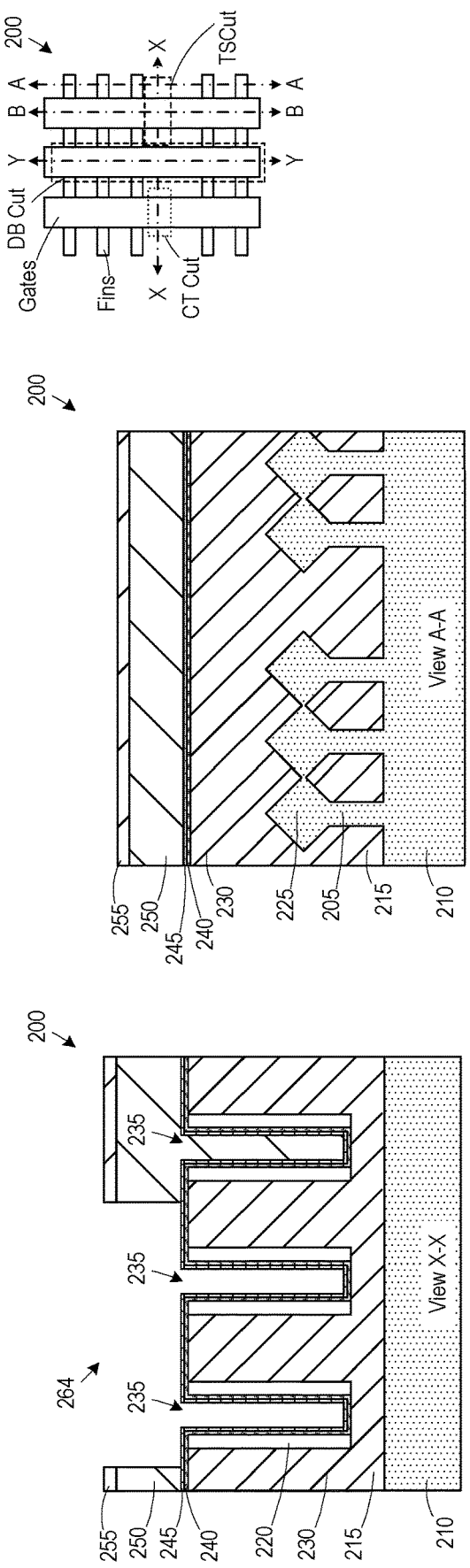

FIG. 2B illustrates the product 200 after a plurality of processes were performed to pattern the hard mask layer 255, and partially etch the OPL layer 250 to define openings 264, 265. In the illustrated embodiment, the hard mask layer 255 was first patterned using a photoresist layer (not shown). The photoresist was formed above the BARC layer 260 (see FIG. 2A) and exposed to radiation using a reticle and developed to generate a pattern. The photoresist pattern was transferred to the BARC layer 260 and the hard mask layer 255, and the photoresist layer and the BARC layer 260 were removed. A partial etch of the OPL layer 250 was performed through the patterned hard mask layer 255.

Figure 2C:
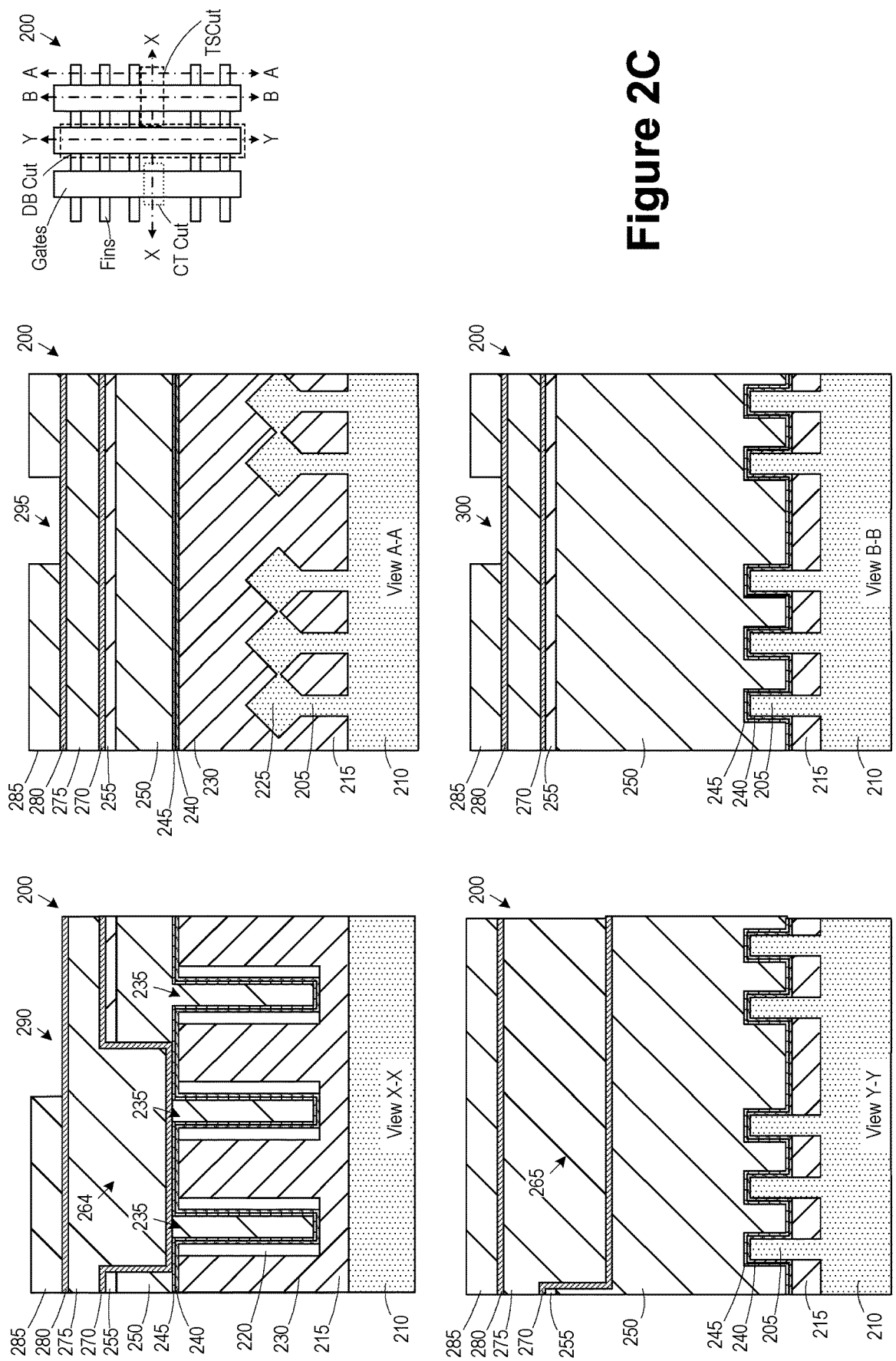

FIG. 2C illustrates the product 200 after a plurality of processes were performed. A plurality of deposition processes were performed to form a hard mask layer 270 (e.g., titanium oxide, or TiOx), to form an OPL layer 275 above the hard mask layer 270 and in the openings 264, 265, to form a hard mask layer 280 (e.g., TiOx) above the OPL layer 275, and to form an OPL layer 285 above the hard mask layer 280. The uppermost OPL layer 285 was patterned (e.g., as described above) to define openings 290, 295, 300.

Figure 2D:
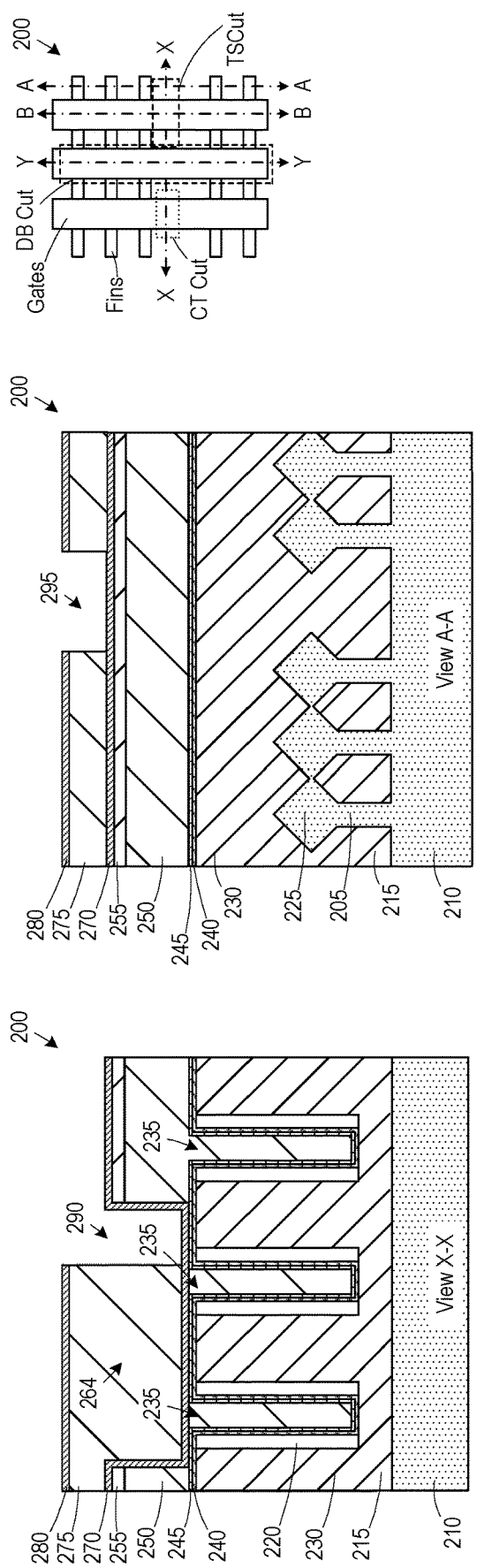
Figure 2D:
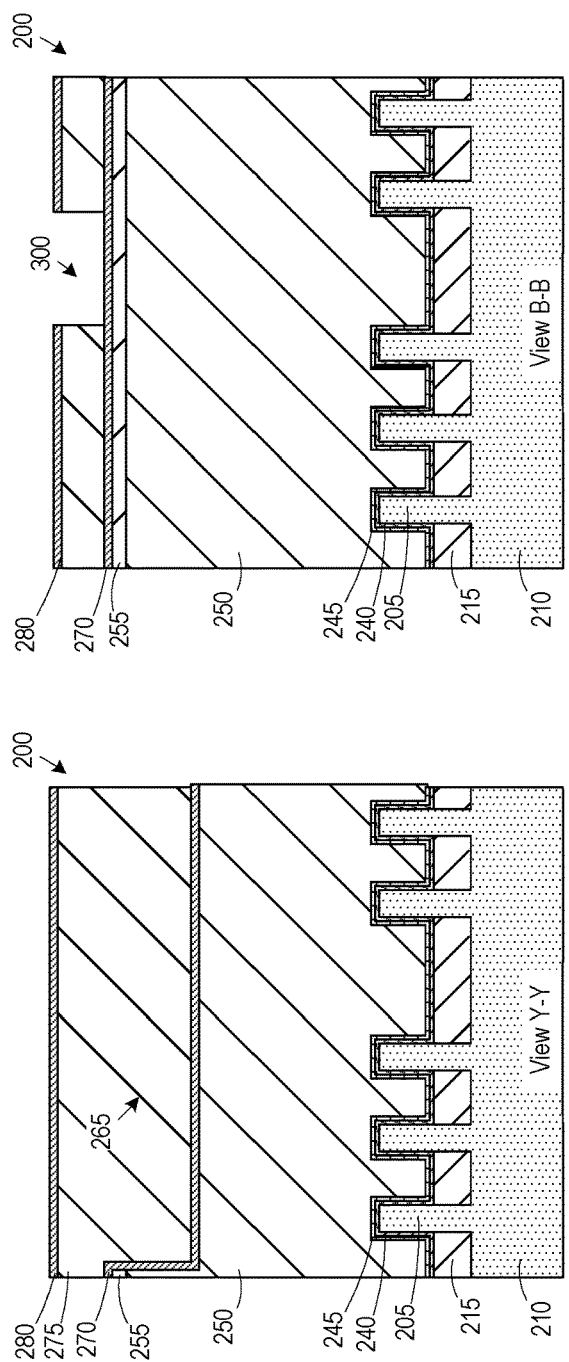

FIG. 2D illustrates the product 200 after a first etch process was performed through the openings 290, 295, 300 to pattern the hard mask layer 280, and a second etch process was performed to etch the OPL layer 275 to extend the openings 290, 295, 300 and to remove remaining portions of the OPL layer 285. The second etch process may terminate on the hard mask layer 270.

Figure 2E:
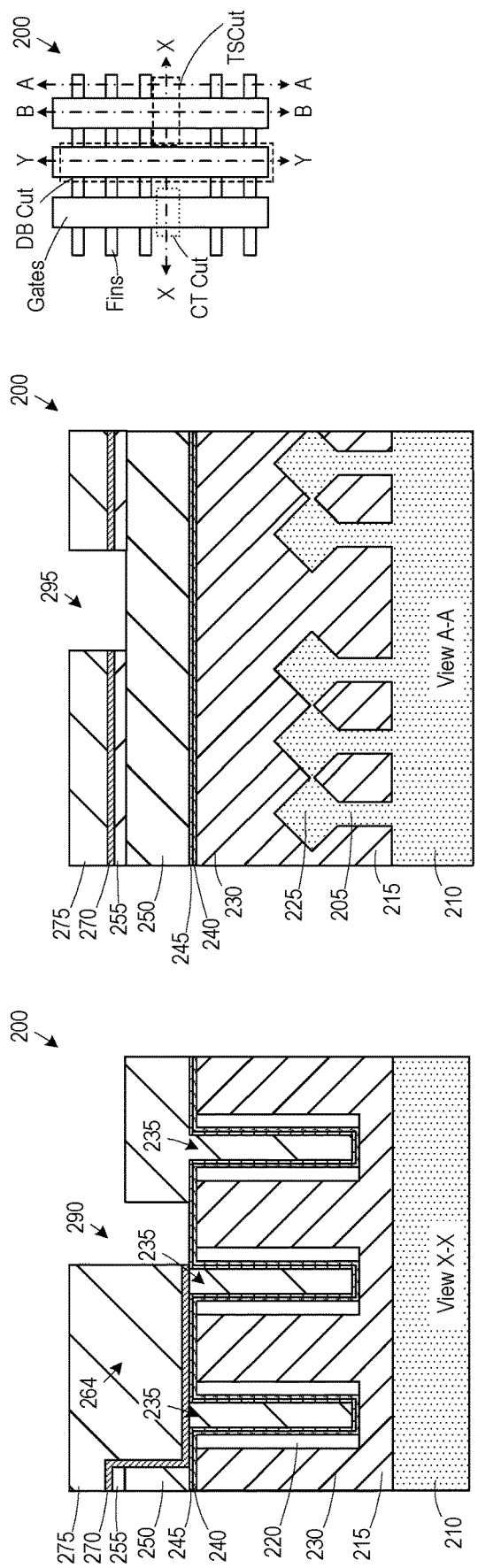
Figure 2E:
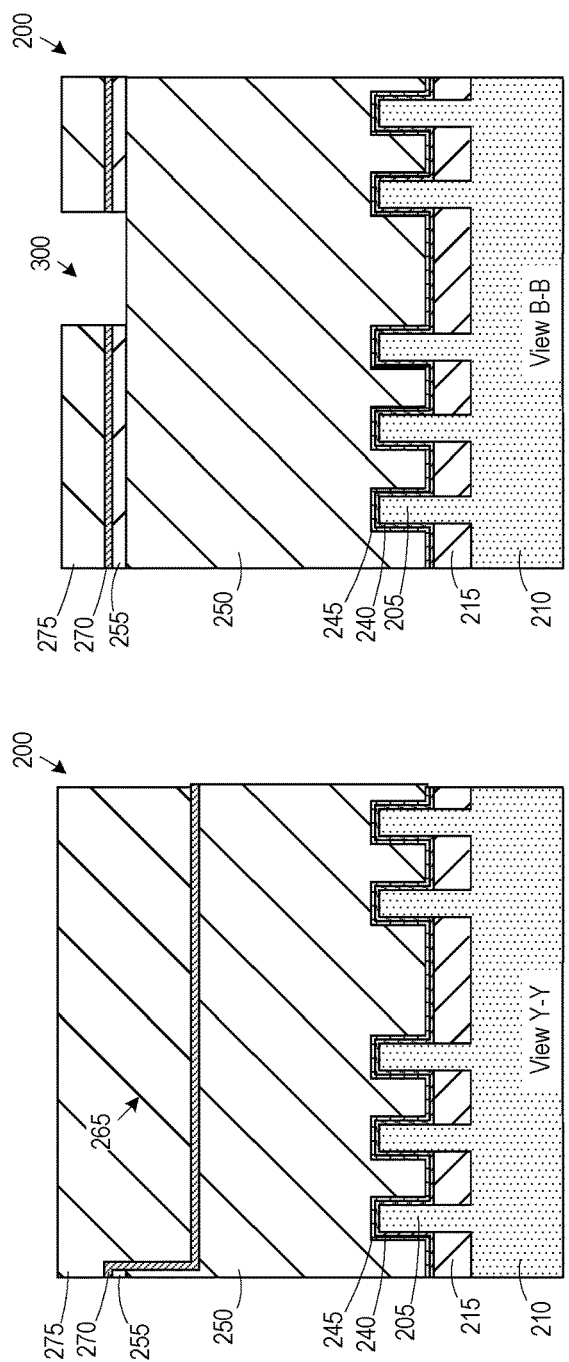

FIG. 2E illustrates the product 200 after one or more etch processes were performed through the openings 290, 295, 300 to remove remaining portions of the hard mask layer 280 and to open the hard mask layer 270.

Figure 2F:
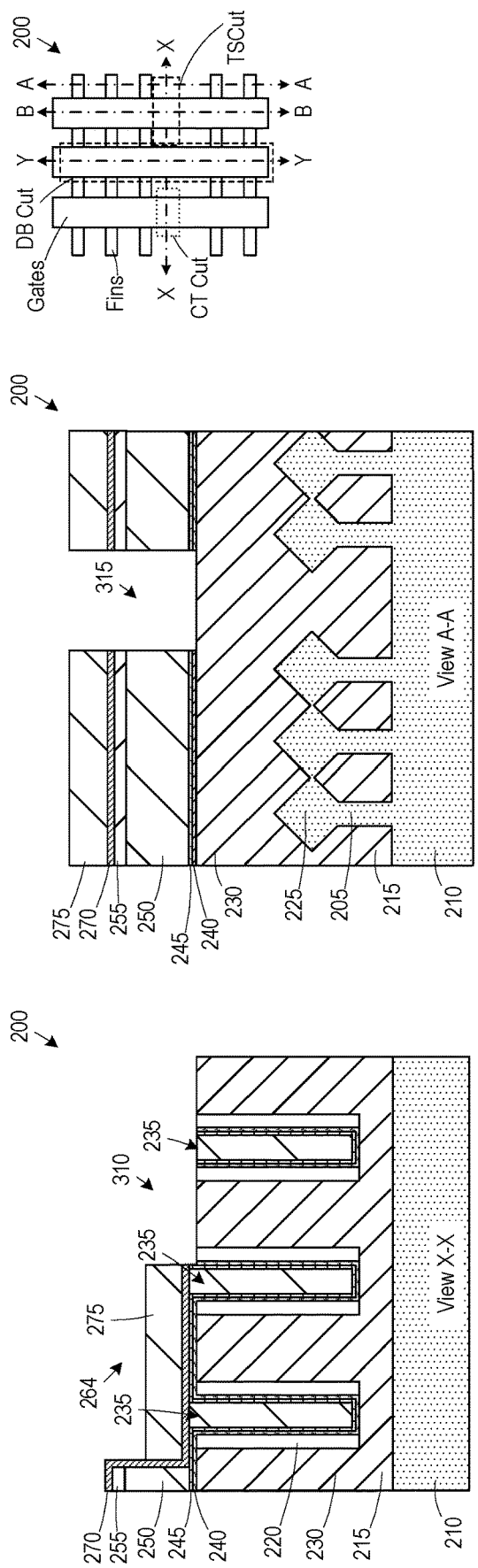
Figure 2F:
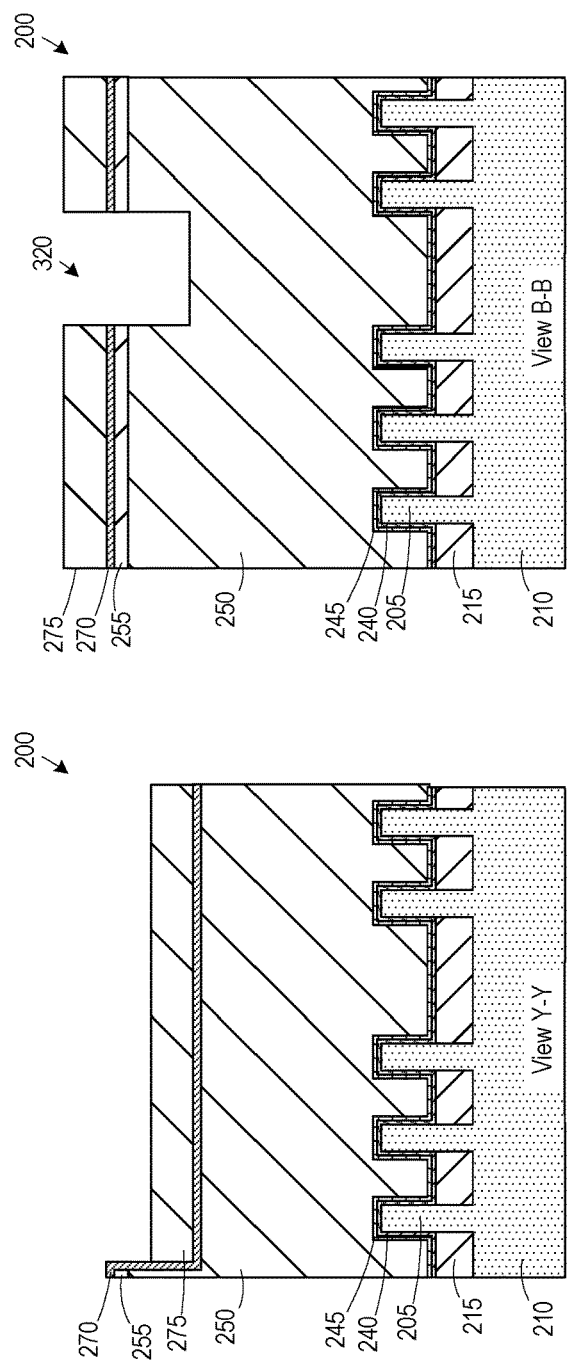

FIG. 2F illustrates the product 200 after several processes were performed. An etch process was performed to recess the OPL layers 250, 275 and expose the WFM layer 245 through openings 310, 315 and to define an opening 320 in the OPL layer 250. The opening 315 is a TS cut opening in the OPL layer 250. One or more etch processes were performed to remove the exposed portions of the WFM layer 245 and the gate insulation layer 240 to expose the underlying dielectric material 230.

Figure 2G:
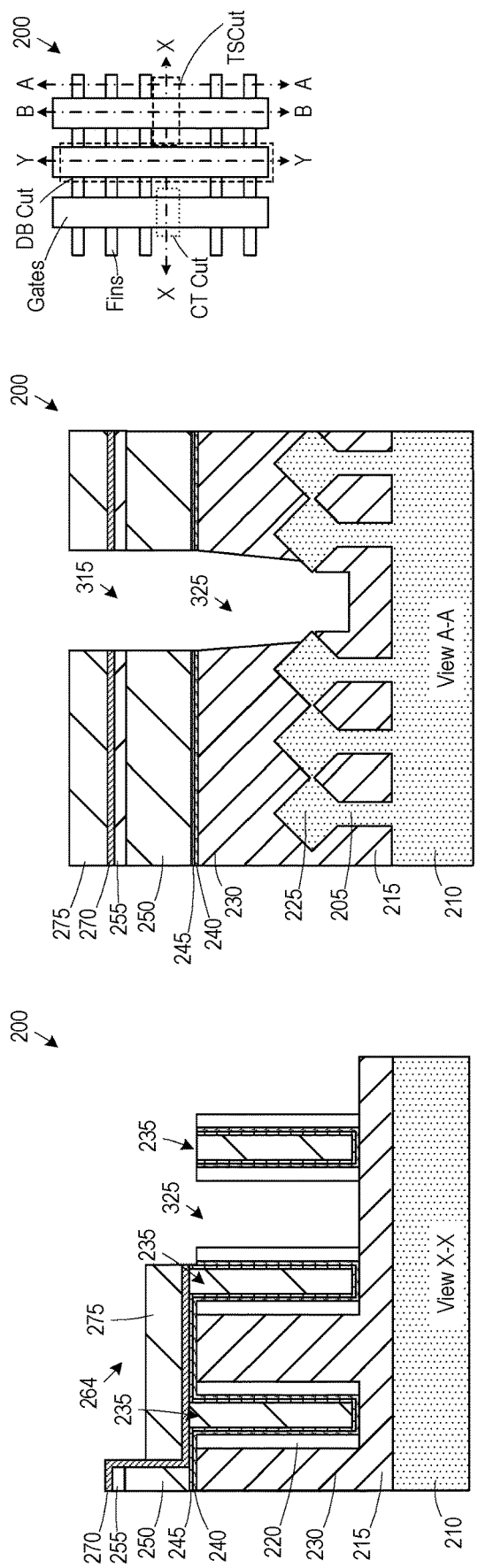
Figure 2G:
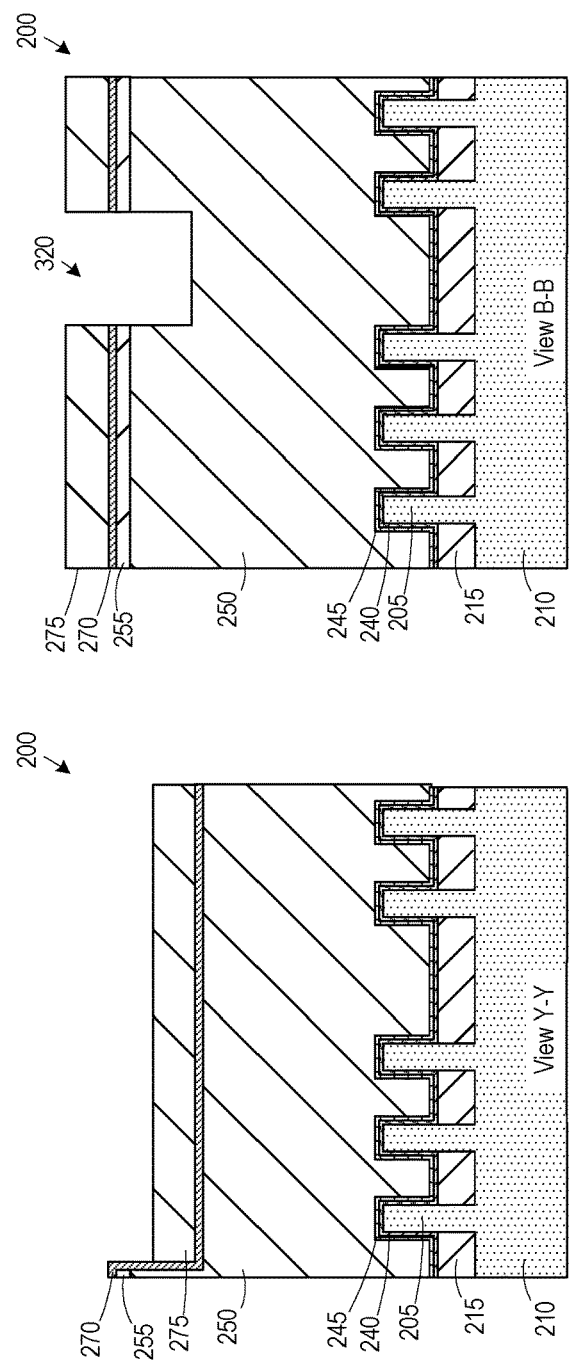

FIG. 2G illustrates the product 200 after an etch process was performed through the TS cut opening 315 to form a TS cut cavity 325 in the dielectric material 230.

Figure 2H:
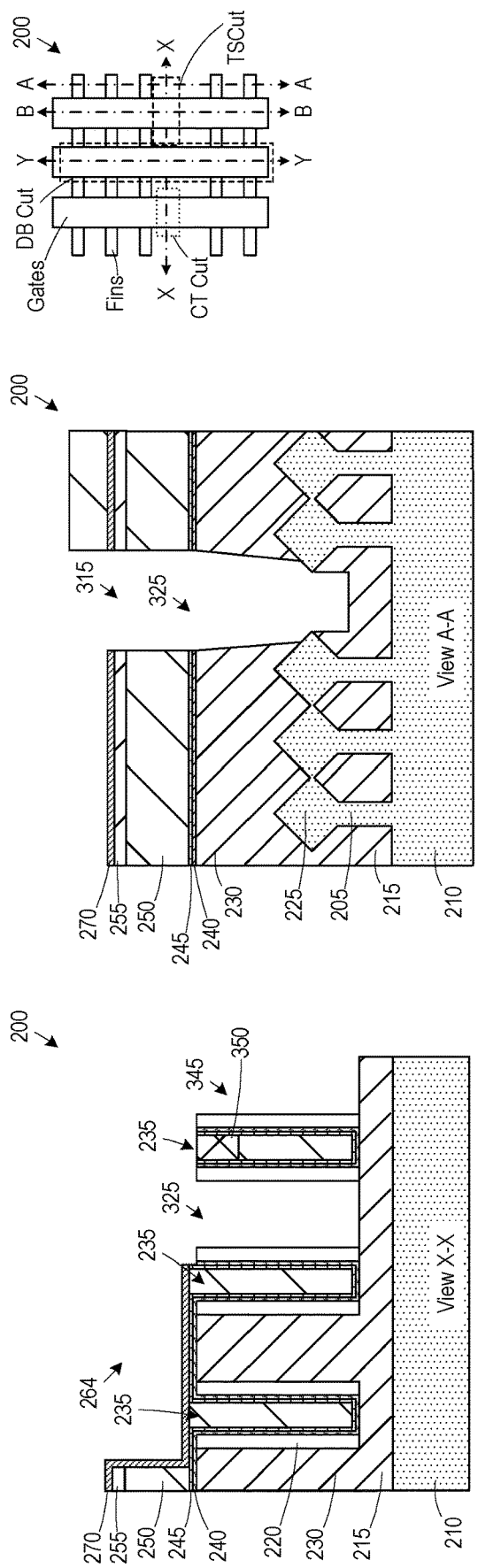
Figure 2H:
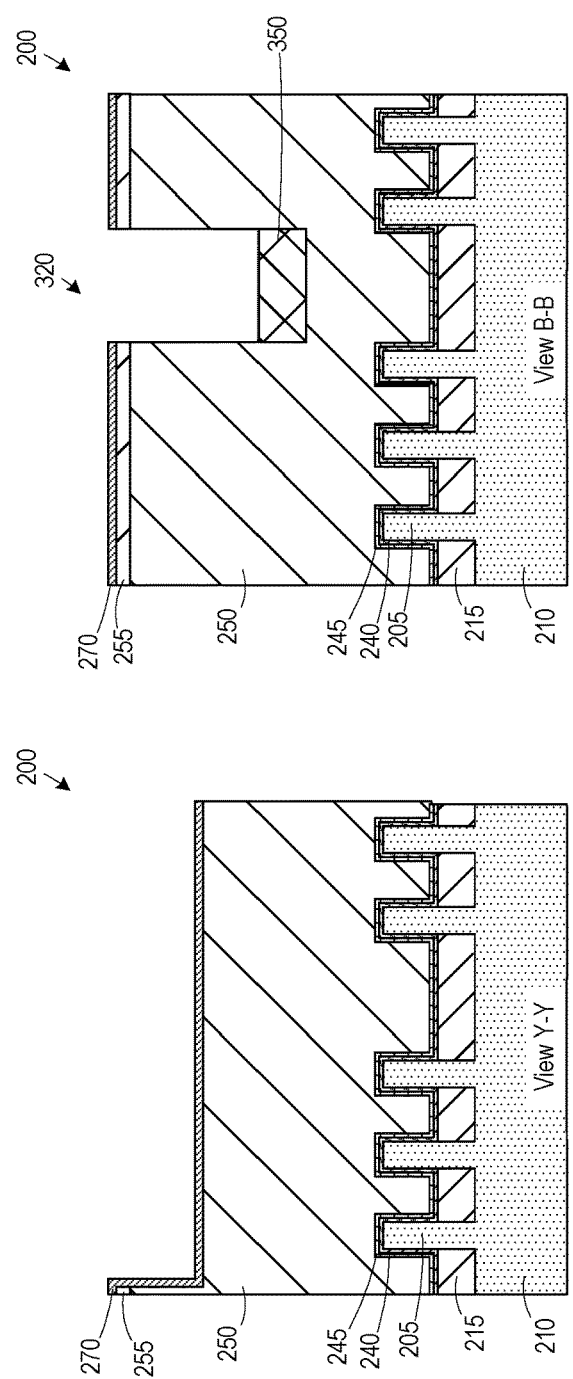

FIG. 2H illustrates the product 200 after several processes were performed. An etch process was performed to recess a portion of the OPL layer 250 disposed in the gate cavity 235 of the sacrificial gate structure 345 in the TS cut region. The opening 320 is also recessed, and remaining portions of the OPL layer 275 are removed. A deposition process was performed to form a cap layer 350 (e.g., SiN, SiC, SiCO, SiBCN, SiOCN, etc.) in the recessed gate cavity 235 of the sacrificial gate structure 345 and in the opening 320.

Figure 2I:
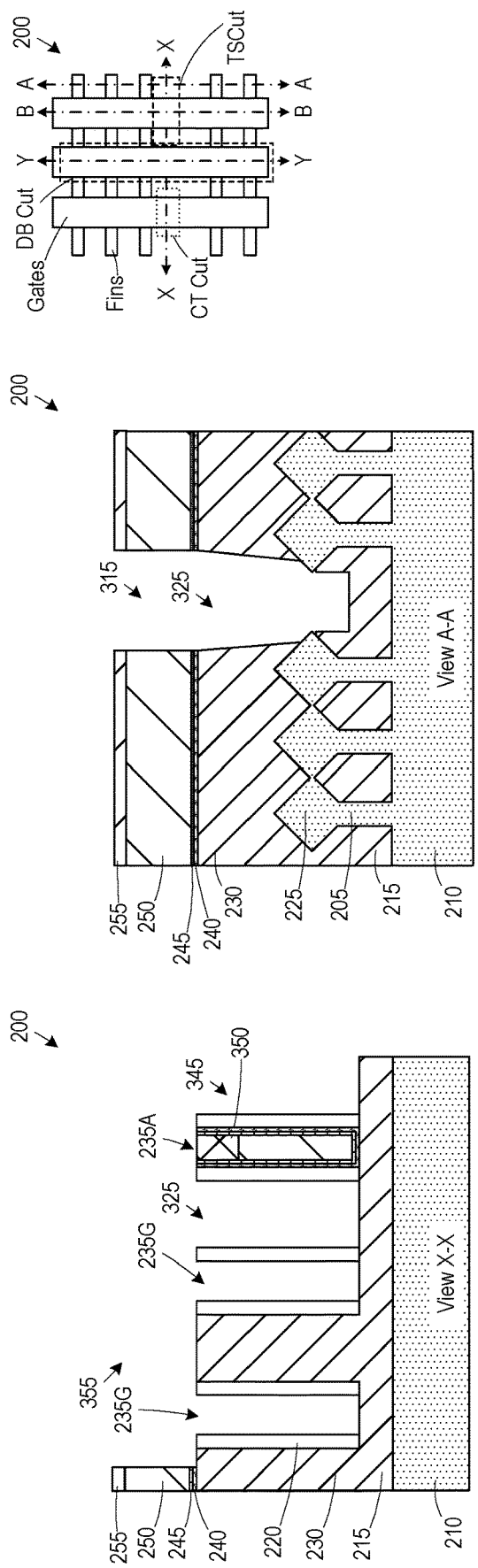
Figure 2I:
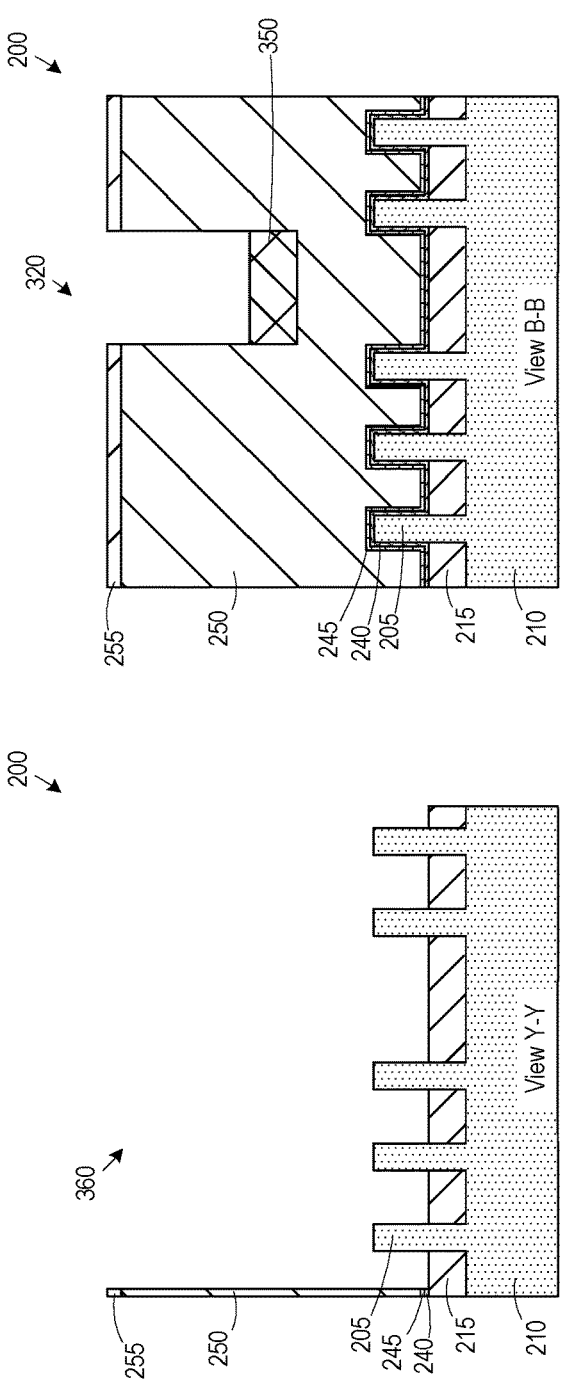

FIG. 2I illustrates the product 200 after several processes were performed. An etch process was performed to remove the remaining portions of the hard mask layer 270. An etch process was performed to recess the OPL layer 250, thereby defining a CT cut opening 355 and a DB cut opening 360 in the OPL layer 250. One or more etch processes were performed to remove the exposed portions of the WFM layer 245 and the gate insulation layer 240 to expose the underlying fins 205 in the DB cut opening 360 and to open the gate cavities 235 in the CT cut opening 355 not protected by the cap layer 350, thereby defining gate cut cavities 235G.

Figure 2J:
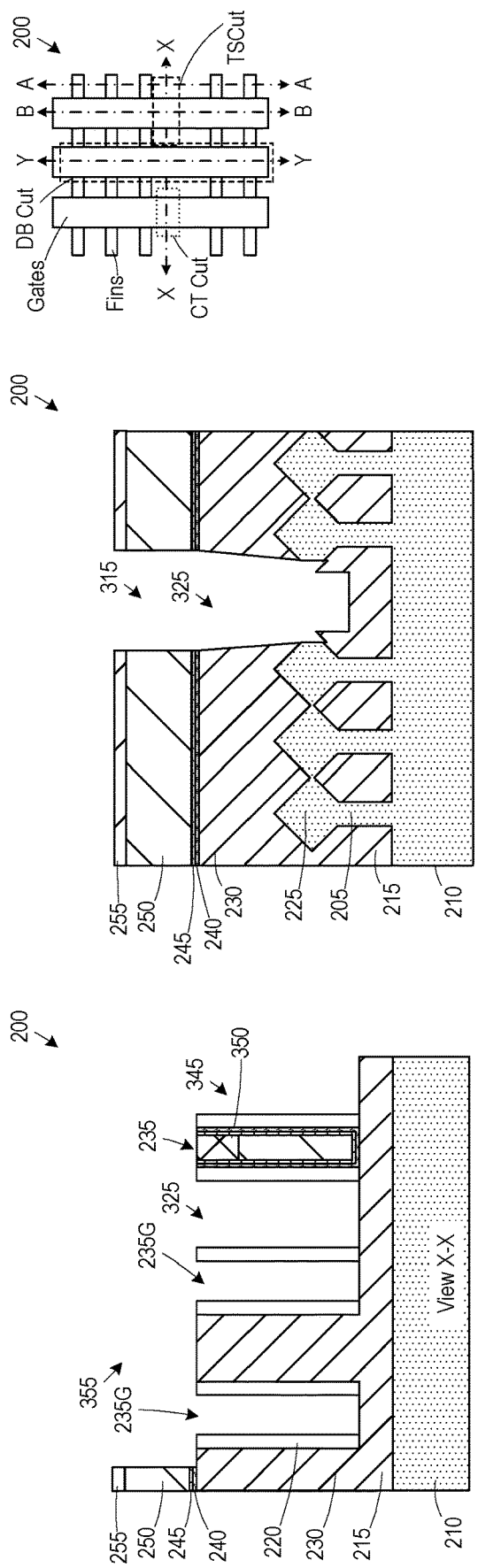
Figure 2J:
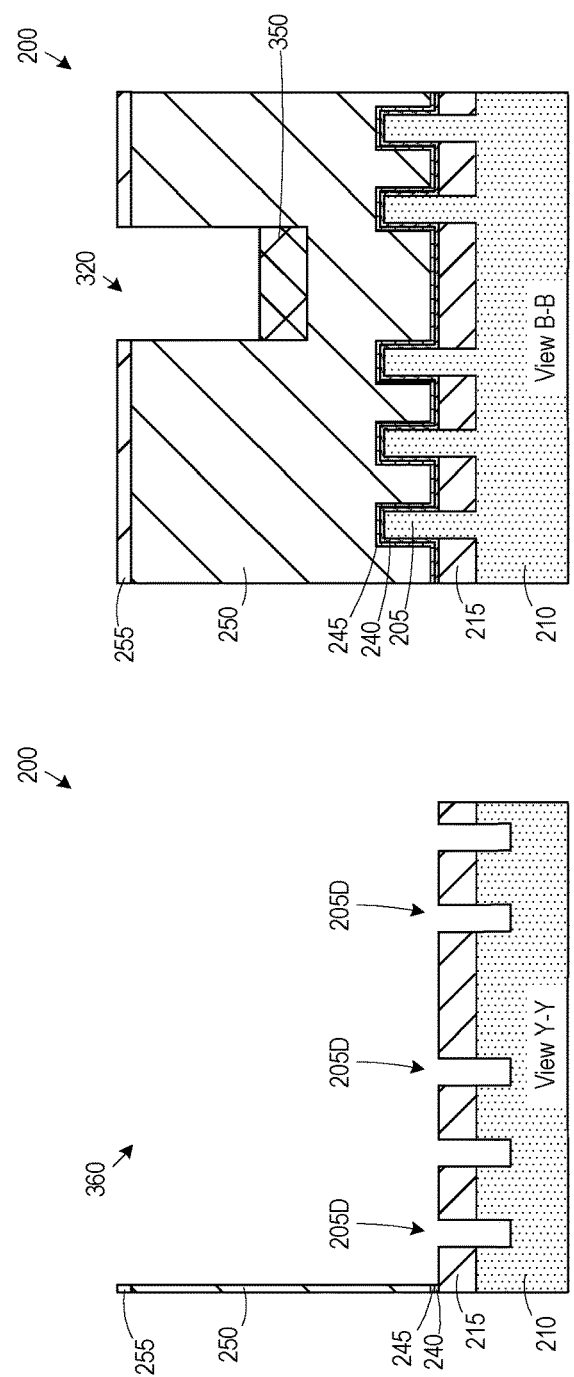

FIG. 2J illustrates the product 200 after an etch process was performed to recess the fins 205 exposed by the DB cut opening 360, thereby defining DB cavities 205D. The recessing also removes some material from the epitaxial material regions 225 exposed by the TS cut opening 315 and the TS cut cavity 325.

Figure 2K:
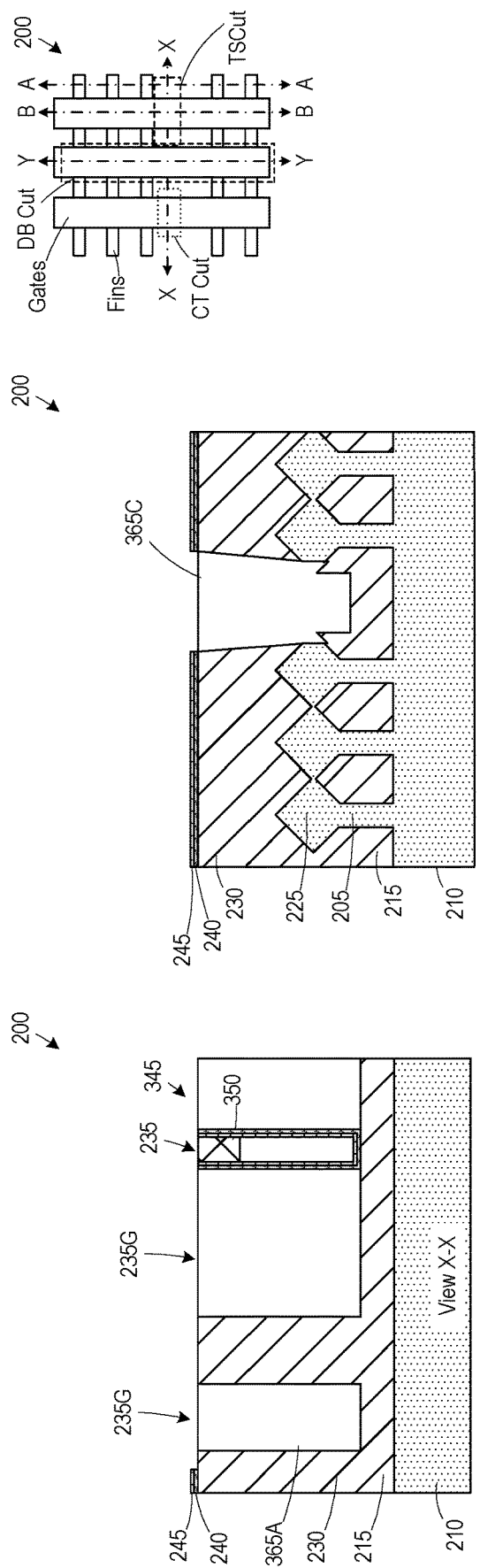
Figure 2K:
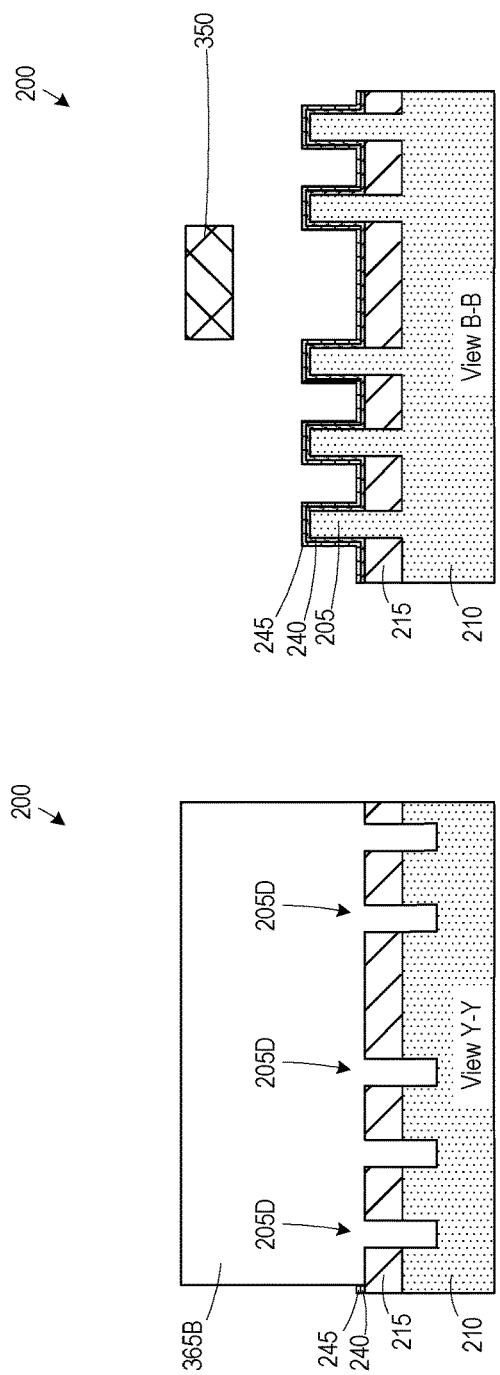

FIG. 2K illustrates the product 200 after several processes were performed. A deposition process was performed to deposit a dielectric material (e.g., silicon nitride) in the gate cut cavities 235G, the DB cavities 205D, and the TS cut cavity 325 to define a gate cut structure 365A, a diffusion break structure 365B and a contact cut structure 365C, respectively. A recess etch process was performed to recess the dielectric material 365A, 365B, 365C to a height approximately equal to the height of the dielectric material 230. Since the spacers 220 may be formed from the same material as the dielectric material for the gate cut structure 365A, they are illustrated as having merged therewith. One or more etch processes were performed to strip the remaining portions of the hard mask layer 255 and the OPL layer 250, including the portions of the OPL layer 250 in the gate cavity 235A. The cap layer 350 is supported on either end by structures disposed into and out of the page, so it remains in place.

Figure 2L:
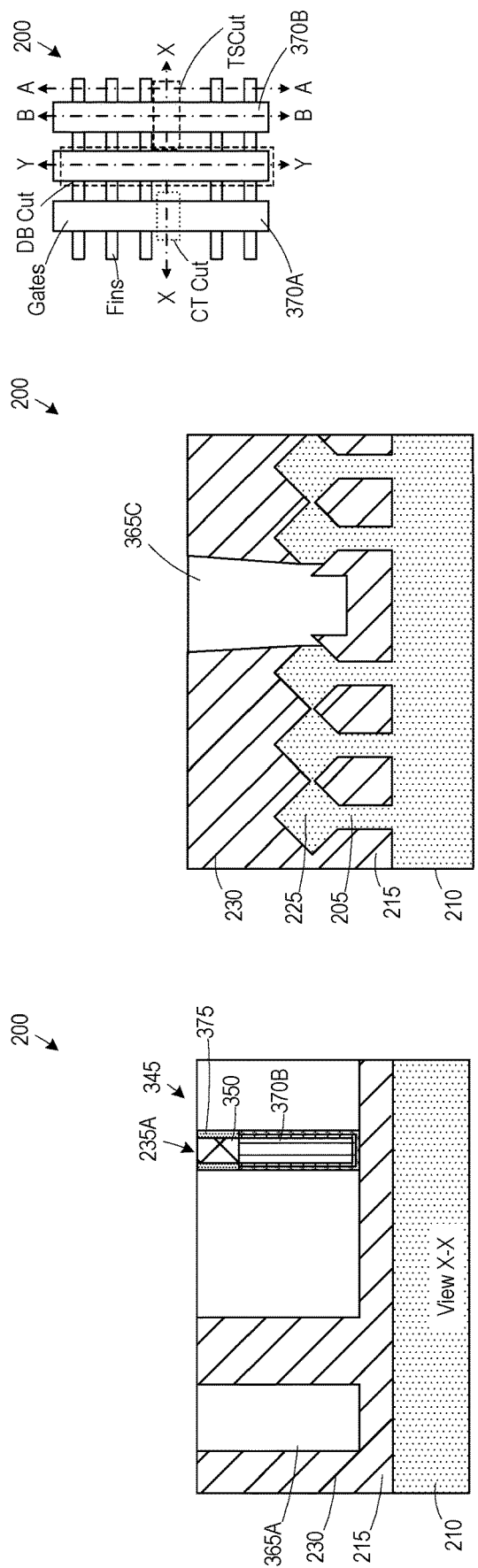
Figure 2L:
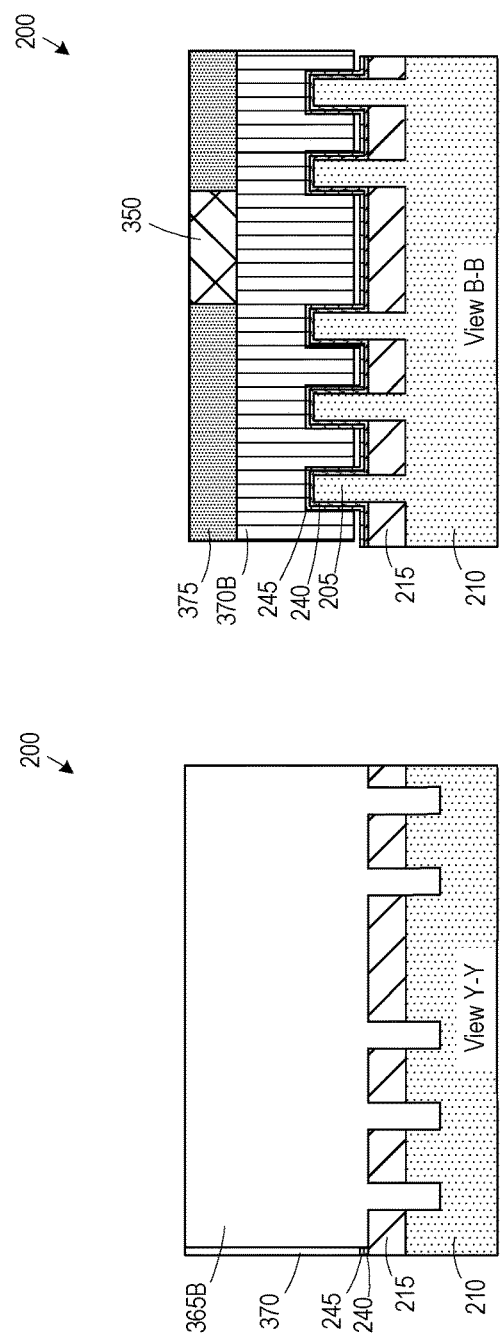

FIG. 2L illustrates the product 200 after a plurality of processes were performed. One or more deposition processes were performed to form one or more conductive layers for replacement gate structures 370A, 370B in the gate cavities 235, 235A (e.g., barrier layers, seed layers, fill layers). The gate cut structure 365A segments the replacement gate structure 370A in its respective gate cavity 235. The conductive material may be planarized and recessed, and a cap layer 375 may be formed. The planarizing may remove residual portions of the gate insulation layer 240 and the WFM material 245 above dielectric material 230, and the recessing may remove portions of the gate insulation layer 240 and the WFM material 245 adjacent the cap layer 350.

Figure 2M:
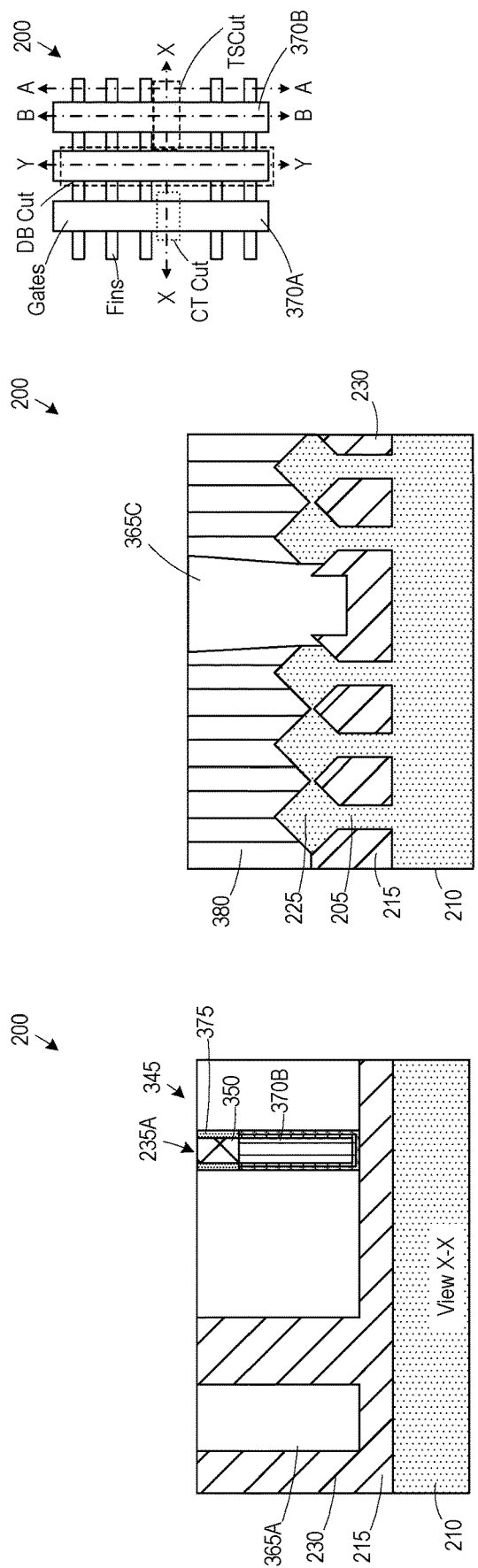
Figure 2M:
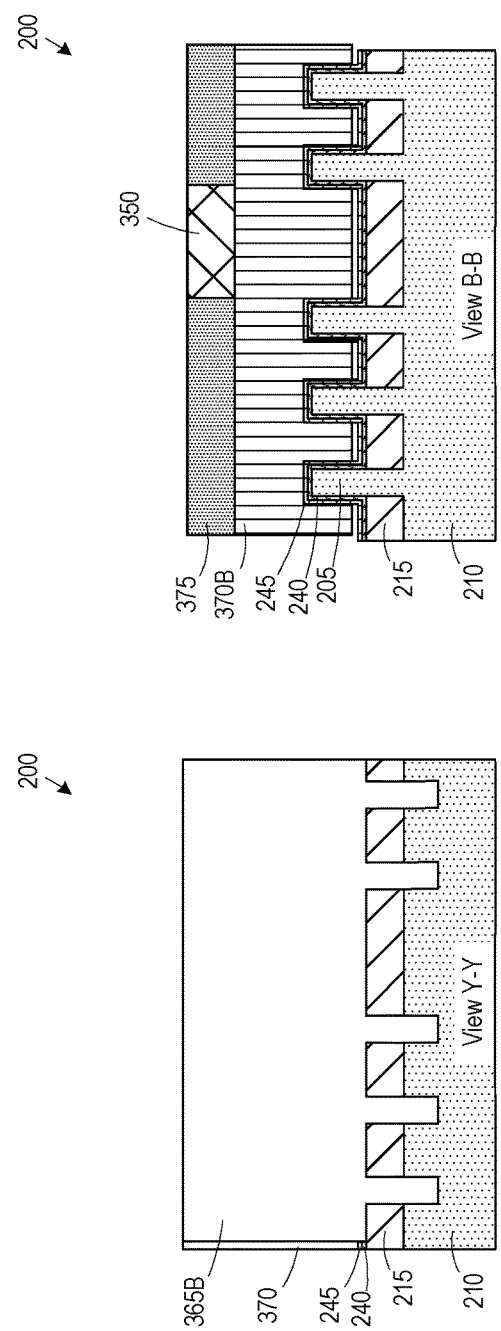

FIG. 2M illustrates the product 200 after a plurality of processes were performed to define TS contacts 380. An etch process was performed to define a contact recess in the dielectric material 230 that exposes the underlying epitaxial material regions 225 in the S/D regions. The dielectric material 365 segments the contact recess and is self-aligned. One or more deposition processes were performed to deposit conductive silicide material for the TS contacts 380. A planarization process was performed to remove excess portions of the silicide material.

Additional process steps may be formed to complete fabrication of the product 200, such as the forming of metallization layers including interconnects for contacting the various portions of the product, such as the source/drain regions, gate structures, etc. The process flow illustrated above has several advantages. Because the CT, DB and TS cut processes are effectuated using a single patterning layer, the process flow is shortened, thereby increasing throughput and reducing costs.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a semiconductor device, comprising a plurality of fins formed above a substrate, an isolation structure positioned between said plurality of fins, a plurality of sacrificial gate structures defining gate cavities, and a first dielectric material positioned between said plurality of sacrificial gate structures;
    forming a first patterning layer above said first dielectric material and in said gate cavities, said first patterning layer having a first opening positioned above a first gate cavity to expose a portion of said isolation structure and to define a first recess, a second opening positioned above a second gate cavity to expose a first portion of said plurality of fins, and a third opening positioned above a first portion of a source/drain region defined in said plurality of fins to expose said first dielectric material;
    etching said first portion of said plurality of fins through said second opening to define a second recess in said substrate;
    etching said first dielectric material through said third opening to define a third recess in said first dielectric material, said third recess exposing a second portion of said plurality of fins; and
    forming a second dielectric material in said first recess to define a gate cut structure, in said second recess to define a diffusion break structure, and in said third recess to define a contact cut structure.

2. The method of claim 1, further comprising:
    etching said first dielectric material layer to define a contact recess, said contact cut structure segmenting said contact recess; and
    forming a source/drain contact structure in said contact recess.

3. The method of claim 1, further comprising:
    removing said first patterning layer to expose said gate cavities; and
    forming a conductive material in said gate cavities, said gate cut structure segmenting said conductive material.

4. The method of claim 1, further comprising forming a gate insulation layer and a work function material layer in said gate cavities and above said first dielectric material prior to forming said first patterning layer.

5. The method of claim 4, further comprising removing portions of said gate insulation layer and said work function material layer exposed by said first opening and positioned in said first gate cavity.

6. The method of claim 4, further comprising removing portions of said gate insulation layer and said work function material layer exposed by said second opening prior to etching said first portion of said plurality of fins through said second opening.

7. The method of claim 4, further comprising removing portions of said gate insulation layer and said work function material layer exposed by said third opening prior to etching said first dielectric material through said third opening.

8. The method of claim 1, further comprising:
    removing a portion of said first patterning layer positioned in a third gate cavity to define a cap recess;
    forming a first cap layer in said cap recess;
    removing a remainder portion of said first patterning layer in said third gate cavity prior to forming said second dielectric material; and
    forming a conductive material in said third gate cavity.

9. The method of claim 8, further comprising:
    forming a gate insulation layer and a work function material layer in said gate cavities and above said first dielectric material prior to forming said first patterning layer;
    recessing a portion of said gate insulation layer and said work function material layer adjacent said first cap layer to define a second cap recess; and
    forming a second cap layer in said second cap recess.

10. The method of claim 8, further comprising:
    removing portions of said first patterning layer, said gate insulation layer and said work function material layer positioned in said first and second gate cavities in the presence of said first gate cap layer; and
    removing said first patterning layer including said remainder portion after removing said portions of said first patterning layer, said gate insulation layer, and said work function material layer positioned in said first and second gate cavities.

11. The method of claim 1, further comprising:
    forming said first patterning layer;
    forming a fourth opening in said first patterning layer above said first gate cavity, said second gate cavity, and a third gate cavity;
    forming a second patterning layer above said first patterning layer and in said fourth opening;
    forming a fifth opening in said second patterning layer above said first portion of said source/drain region and a sixth opening in said second patterning layer above said third gate cavity; and
    etching said second patterning layer through said fifth and sixth openings to form said third opening in said first patterning layer and to remove a portion of said first patterning layer positioned above said third gate recess.

12. The method of claim 11, further comprising removing said second patterning layer after etching said first dielectric material through said third opening to define a third recess in said first dielectric material.

13. The method of claim 12, further comprising etching said first patterning layer to deepen said fourth opening to define said first and second openings therein.

14. The method of claim 1, further comprising:
forming said first patterning layer;
forming a fourth opening in said first patterning layer above said first gate cavity, said second gate cavity, and a third gate cavity;
forming a second patterning layer above said first patterning layer and in said fourth opening;
forming a third patterning layer above said second patterning layer, said third patterning layer having a fifth opening positioned above said first portion of said source/drain region and a sixth opening positioned above said third gate cavity;
etching said second patterning layer through said fifth and sixth openings to define a seventh opening in said second patterning layer above said first portion of said source/drain region and an eighth opening in said second patterning layer positioned above said third gate cavity;
removing said third patterning layer; and
etching said first patterning layer through said seventh and eighth openings to form said third opening in said first patterning layer and to remove a portion of said first patterning layer above said third gate recess.

15. The method of claim 14, further comprising removing said second patterning layer after etching said first dielectric material through said third opening to define a third recess in said first dielectric material.

16. The method of claim 15, further comprising etching said first patterning layer to deepen said fourth opening to define said first and second openings therein.

17. A method, comprising:
forming a semiconductor device comprising a plurality of fins formed above a substrate, an isolation structure positioned between said plurality of fins, a plurality of sacrificial gate structures defining gate cavities, a first dielectric material positioned between said plurality of sacrificial gate structures, and a gate insulation layer and a work function material layer positioned in said gate cavities and above said first dielectric material;
forming a first patterning layer above said first dielectric material and in said gate cavities, said first patterning layer having a first opening positioned above a first gate cavity to expose a portion of said isolation structure and define a first recess, a second opening positioned above a second gate cavity to expose a first portion of said plurality of fins, and a third opening positioned above a first portion of a source/drain region defined in said plurality of fins to expose said first dielectric material;
removing portions of said gate insulation layer and said work function material layer exposed by said first and second openings and positioned in said first and second gate cavities;
etching said first portion of said plurality of fins through said second opening to define a second recess in said substrate;
removing portions of said gate insulation layer and said work function material layer exposed by said third opening;
etching said first dielectric material through said third opening to define a third recess in said first dielectric material, said third recess exposing a second portion of said plurality of fins; and
forming a second dielectric material in said first recess to define a gate cut structure, in said second recess to define a diffusion break structure, and in said third recess to define a contact cut structure.

18. The method of claim 17, further comprising:
removing a portion of said first patterning layer positioned in a third gate cavity to define a cap recess;
forming a first cap layer in said cap recess;
removing a remainder portion of said first patterning layer in said third cavity prior to forming said second dielectric material; and
forming a conductive material in said third gate cavity.

19. The method of claim 18, further comprising:
recessing a portion of said gate insulation layer and said work function material layer adjacent said first cap layer to define a second cap recess; and
forming a second cap layer in said second cap recess.

20. The method of claim 19, further comprising:
removing portions of said first patterning layer, said gate insulation layer, and said work function material layer positioned in said first and second gate cavities in the presence of said first gate cap layer; and
removing said first patterning layer including said remainder portion after removing said portions of said first patterning layer, said gate insulation layer, and said work function material layer positioned in said first and second gate cavities.

* * * * *